United States Patent
Lu et al.

(10) Patent No.: US 12,108,594 B2
(45) Date of Patent: Oct. 1, 2024

(54) SEMICONDUCTOR DEVICE MANUFACTURING METHOD COMPRISING FIRST CONDUCTIVE LAYER WITH INCREASED ROUGHNESS IN ARRAY REGION

(71) Applicant: CHANGXIN MEMORY TECHNOLOGIES, INC., Hefei (CN)

(72) Inventors: Jingwen Lu, Hefei (CN); Bingyu Zhu, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 483 days.

(21) Appl. No.: 17/370,503

(22) Filed: Jul. 8, 2021

(65) Prior Publication Data

US 2022/0052056 A1 Feb. 17, 2022

Related U.S. Application Data

(63) Continuation of application No. PCT/CN2021/074295, filed on Jan. 29, 2021.

(30) Foreign Application Priority Data

Aug. 14, 2020 (CN) .......................... 202010816754.X

(51) Int. Cl.
   *H10B 12/00* (2023.01)
   *G11C 5/06* (2006.01)
(52) U.S. Cl.
   CPC ........... *H10B 12/485* (2023.02); *G11C 5/063* (2013.01); *H10B 12/03* (2023.02); *H10B 12/30* (2023.02); *H10B 12/482* (2023.02); *H10B 12/50* (2023.02)

(58) Field of Classification Search
   None
   See application file for complete search history.

(56) References Cited

U.S. PATENT DOCUMENTS

| | | |
|---|---|---|
| 6,784,501 B2 | 8/2004 | Lane |
| 6,794,238 B2 | 9/2004 | Lane |

(Continued)

FOREIGN PATENT DOCUMENTS

| | | |
|---|---|---|
| CN | 1122311 C | 9/2003 |
| CN | 1553497 A | 12/2004 |

(Continued)

OTHER PUBLICATIONS

Supplementary European Search Report in the European application No. 21855052.3, mailed on Dec. 5, 2022.

(Continued)

*Primary Examiner* — Daniel Whalen
(74) *Attorney, Agent, or Firm* — Syncoda LLC; Feng Ma

(57) ABSTRACT

A semiconductor manufacturing method includes: providing a semiconductor substrate, in which the semiconductor substrate includes an array region and a peripheral circuit region, in the array region, multiple capacitor contact holes are on the semiconductor substrate, and a first conductive layer is deposited on a bottom of each of the capacitor contact hole, and in the peripheral circuit region, a device layer is on the semiconductor substrate; treating the first conductive layer to increase its roughness; forming wire contact holes exposing the semiconductor substrate in the peripheral circuit region; forming a transition layer that at least covers a surface of the first conductive layer and a surface of the semiconductor substrate exposed by the wire contact holes; and forming a second conductive layer that covers the transition layer, and fills the capacitor contact holes and the wire contact holes.

8 Claims, 9 Drawing Sheets

(56) References Cited

U.S. PATENT DOCUMENTS

| | | | |
|---|---|---|---|
| 7,205,219 | B2 | 4/2007 | Oh |
| 7,495,292 | B2 | 2/2009 | Oh |
| 9,666,262 | B2 | 5/2017 | Kim et al. |
| 2003/0087499 | A1 | 5/2003 | Lane |
| 2003/0183822 | A1 | 10/2003 | Lane |
| 2004/0183111 | A1 | 9/2004 | Shinkawata |
| 2004/0219744 | A1 | 11/2004 | Oh |
| 2006/0226461 | A1 | 10/2006 | Shinkawata |
| 2007/0145485 | A1 | 6/2007 | Oh |
| 2008/0061340 | A1 | 3/2008 | Heineck |
| 2008/0099810 | A1 | 5/2008 | Shinkawata |
| 2008/0099813 | A1 | 5/2008 | Shinkawata |
| 2011/0133293 | A1 | 6/2011 | Shinkawata |
| 2012/0012936 | A1 | 1/2012 | Shinkawata |
| 2012/0193696 | A1* | 8/2012 | Fukushima ....... H01L 21/76897 257/306 |
| 2013/0242643 | A1 | 9/2013 | Kim et al. |
| 2013/0288437 | A1 | 10/2013 | Shinkawata |
| 2017/0069726 | A1* | 3/2017 | Kye ................... H01L 21/7682 |
| 2017/0221543 | A1 | 8/2017 | Kim et al. |
| 2018/0226409 | A1 | 8/2018 | Wang et al. |
| 2019/0139961 | A1* | 5/2019 | Lee .................... H10B 12/0335 |
| 2019/0206874 | A1 | 7/2019 | Wang et al. |

FOREIGN PATENT DOCUMENTS

| | | |
|---|---|---|
| CN | 1610969 A | 4/2005 |
| CN | 101140935 A | 3/2008 |
| JP | 2003068670 A | 3/2003 |
| JP | 2005026641 A | 1/2005 |
| JP | 2005509288 A | 4/2005 |
| JP | 2011249583 A | 12/2011 |
| JP | 2013051250 A | 3/2013 |

OTHER PUBLICATIONS

International Search Report in the international application No. PCT/CN2021/074295, mailed on May 20, 2021.

First Office Action of the Japanese application No. 2022-538408, issued on Aug. 1, 2023. 8 pages with English translation.

Written Opinion of the International Search Authority in the international application No. PCT/CN2021/074295, mailed on May 20, 2021. 7 pages with English translation.

* cited by examiner

SEMICONDUCTOR DEVICE MANUFACTURING METHOD COMPRISING FIRST CONDUCTIVE LAYER WITH INCREASED ROUGHNESS IN ARRAY REGION

CROSS-REFERENCE TO RELATED APPLICATIONS

The present application is a continuation of International Application No. PCT/CN2021/074295 filed on Jan. 29, 2021, which claims priority to Chinese Patent Application No. 202010816754.X filed on Aug. 14, 2020. The disclosures of these applications are hereby incorporated by reference in their entirety.

BACKGROUND

Dynamic random-access memory (DRAM) is a common semiconductor storage device in computers, and has a storage array region composed of a number of repeated storage units. Each storage unit typically includes a capacitor and a transistor. In a transistor, a gate connects to a bit line structure, either a drain or a source connects to the bit line structure, and another of the drain and the source connects to the capacitor. A voltage signal on the bit line structure can control on or off of the transistor, and then through the bit line structure, data information stored in the capacitor can be read, or through the bit line structure, the data information can be written into the capacitor for storage.

SUMMARY

The present disclosure relates generally to the field of semiconductor manufacturing, and more specifically to a semiconductor structure and a manufacturing method thereof.

A semiconductor structure and a manufacturing method can be provided to form a transition layer having different thicknesses respectively in the array region and in the peripheral circuit region, to improve the conductivity of the wire in the array region and to avoid the current leakage in the peripheral circuit region due to the excessive thickness of the transition layer.

A method for manufacturing a semiconductor structure can include the following steps, in which a semiconductor substrate is provided, which includes an array region and a peripheral circuit region, in which in the array region, multiple capacitor contact holes are provided on the semiconductor substrate, and a first conductive layer is deposited on a bottom of each of the capacitor contact holes, and in the peripheral circuit region, a device layer is provided on the semiconductor substrate; the first conductive layer is treated to increase its roughness; wire contact holes are formed in the peripheral circuit region, in which the semiconductor substrate is exposed by the wire contact holes; a transition layer is formed, which at least covers a surface of the first conductive layer and a surface of the semiconductor substrate exposed by the wire contact holes; and a second conductive layer is formed, which covers the transition layer, and fills the capacitor contact holes and the wire contact holes.

In some embodiments, multiple discrete bit line structures are formed on the semiconductor substrate, and the capacitor contact holes are respectively provided between the bit line structures, and before the step of treating the first conductive layer, the bit line structures of the array region and the device layer of the peripheral circuit region are thinned.

In some embodiments, each of the bit line structures may include a bit line contact island and a bit line, in which the bit line contact island contacts the semiconductor substrate, the bit line is arranged on the bit line contact island, and the bit line includes a conductive layer and a dielectric layer which is disposed on the conductive layer, and in the thinning step, the dielectric layer is thinned.

In some embodiments, the step of treating the first conductive layer further includes that: ion implantation is performed to the first conductive layer to damage surface evenness of the first conductive layer and increase the roughness of the first conductive layer.

In some embodiments, the conductive layer is a polysilicon layer, and the step of performing the ion implantation to the first conductive layer includes performing germanium ion, carbon ion or arsenic ion implantation to the first conductive layer.

In some embodiments, in the step of performing the ion implantation to the first conductive layer, a deposition layer is also formed on a surface of the device layer of the peripheral circuit region.

In some embodiments, the method further includes the following steps: an isolation layer, which covers surfaces of the array region and the peripheral circuit region, is formed after the step of treating the first conductive layer; and the isolation layer is removed after the step that the wire contact holes are formed in the peripheral circuit region.

In some embodiments, the step of forming the transition layer further includes that: a cobalt layer is deposited at the bottom of each of the capacitor contact holes and a bottom of each of the wire contact holes, cobalt reacts with the first conductive layer and the semiconductor substrate to form the transition layer; and a rapid thermal process (RTP) is performed.

In some embodiments, a thickness of the transition layer located in the array region is greater than that of the transition layer located in the peripheral circuit region.

In some embodiments, the second conductive layer may include an adhesion layer and a metal conductive layer, and the step of forming the second conductive layer further includes that the adhesion layer is formed on a surface of the transition layer.

The metal conductive layer is formed on a surface of the adhesion layer, and the metal conductive layer fills the capacitor contact holes and the wire contact holes.

The disclosure further provides a semiconductor structure, which may include: a semiconductor substrate including an array region and a peripheral circuit region, in which in the array region, multiple capacitor contact holes are provided on the semiconductor substrate, which expose the semiconductor substrate, and in the peripheral circuit region, multiple wire contact holes are provided on the semiconductor substrate, which expose the semiconductor substrate; multiple capacitor conductive structures are respectively arranged in the capacitor contact holes, each of the capacitor conductive structures includes a first conductive layer filling a part of the capacitor contact holes, a transition layer at least covering the first conductive layer and a second conductive layer covering the transition layer and filling the capacitor contact holes, in which the first conductive layer contacts the semiconductor substrate; and multiple wire structures are respectively arranged in the conductive contact holes, each of the wire structures includes a transition layer covering a surface of the semiconductor substrate, and a second conductive layer covers the transition layer and fills the wire contact holes, in which the transition layer contacts the semiconductor substrate, wherein thickness of the transition layer of the capacitor conductive structure is greater than that of the transition layer of the wire structure.

In some embodiments, in the peripheral circuit region, a structure layer is provided on the semiconductor substrate, and the wire contact holes penetrate through the structure layer.

In some embodiments, each of the capacitor conductive structures further includes an ion implantation layer, the ion implantation layer is located in the first conductive layer, and in the peripheral circuit region, the structure layer further includes a device layer and a deposition layer located on the device layer, and the deposition layer and the ion implantation layer are the layers of a same material.

In some embodiments, in the array region, multiple discrete bit line structures are arranged on the semiconductor substrate, and the capacitor contact holes are respectively arranged between the bit line structures.

In some embodiments, each of the bit line structures includes a bit line contact island and a bit line, the bit line contact island contacts the semiconductor substrate, the bit line is arranged on the bit line contact island, and the bit line includes a conductive layer and a dielectric layer which is disposed on the conductive layer.

In some embodiments, the second conductive layer may include an adhesion layer and a metal conductive layer, in which the adhesion layer at least covers a surface of the transition layer, and the metal conductive layer covers the adhesion layer, and fills the capacitor contact holes and the wire contact holes.

Various embodiments of the present disclosure can have one or more of the following advantages: in the array region, roughening is performed on the surface of the first conductive layer, such that the transition layer formed in the same step has different thicknesses in the array region and in the peripheral circuit region, thereby meeting different requirements of the array region and the peripheral circuit region on the thicknesses of the transition layer, which improves the conductivity of the wire in the array region, avoids the current leakage of the peripheral circuit region due to the excessive thickness of the transition layer, thus greatly improves the performance of the semiconductor structure. Moreover, the method has simple processes, and does not involve any additional troublesome processes.

DETAILED DESCRIPTION

The specific examples of the semiconductor structure and the method for manufacturing the same provided by the disclosure will be described below in detail in combination with the accompanying drawings.

Upon miniaturization of the manufacture procedure, the contact resistance at each wire connection position in the DRAM becomes increasingly important. Among them, the contact resistance at a conductive connection position of a capacitor with a transistor in the array region of the DRAM, and the contact resistance at a wire connection position of a source-drain region of a Metal Oxide Semiconductor (MOS) tube in the peripheral circuit region are particularly important. At present, during manufacture of a wire structure, a transition layer is deposited first prior to deposition of a metal wire, so as to reduce the contact resistance, and increase the connection performance between layers.

The transition layer in the array region and in the peripheral circuit region has the same thickness because it is formed in the same step. For the array region, the thicker the transition layer, the larger the conducting current, and the better the wire performance; whereas for the peripheral circuit region, the excessively thick transition layer will result in an over high conducting current thereby possibly causing the breakdown effect and increased current leakage.

Various embodiments of the present application can address how to form a transition layer having different thicknesses respectively in the array region and in the peripheral circuit region.

Figure 1:
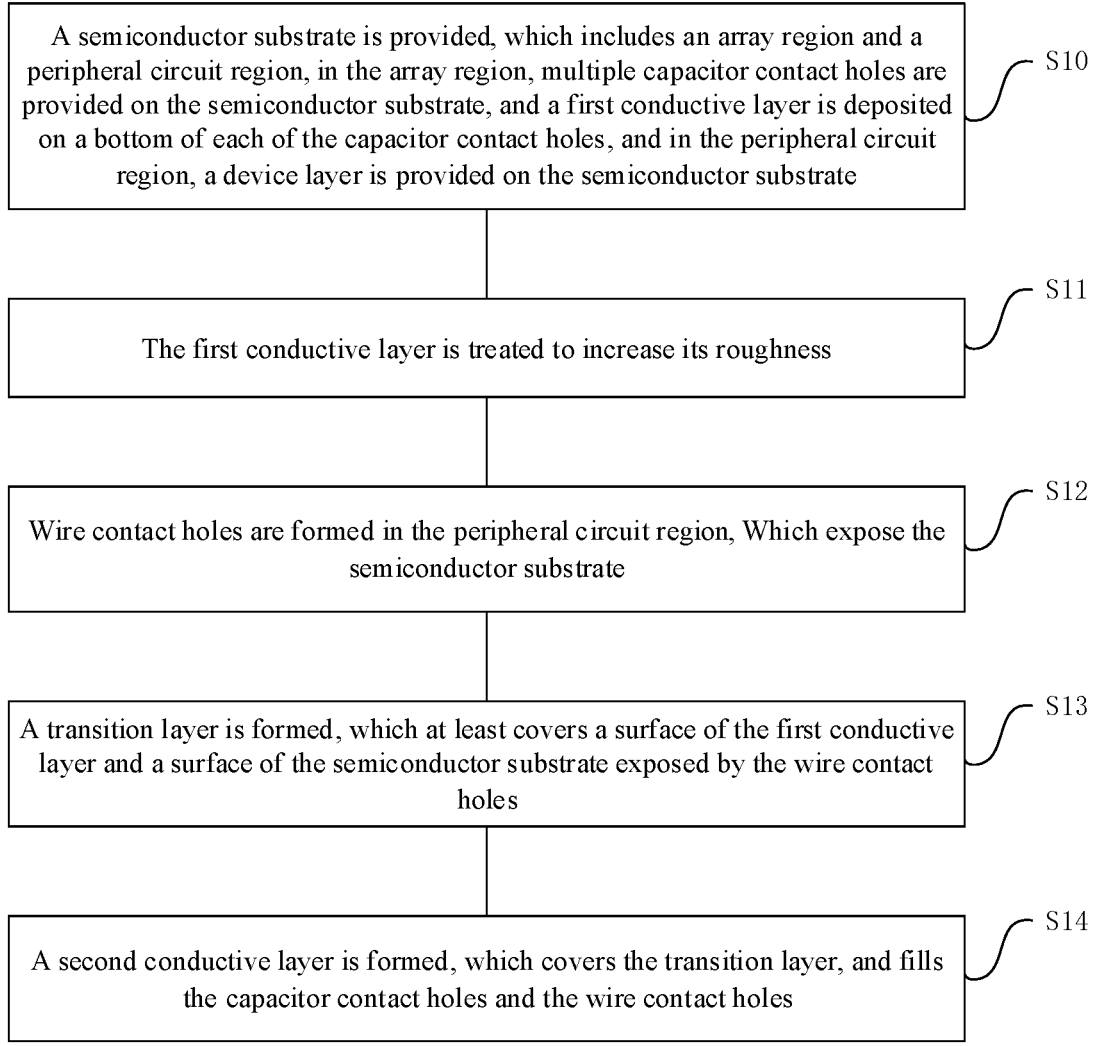
FIG. 1 illustrates a schematic diagram of steps of a method for manufacturing a semiconductor structure in some embodiments of the disclosure.

FIG. 1 illustrates a schematic diagram of steps of a method for manufacturing a semiconductor structure in some embodiments of the disclosure. Referring to FIG. 1, the method for manufacturing the semiconductor structure may include the following steps. At S10, a semiconductor substrate is provided. The semiconductor substrate includes an array region and a peripheral circuit region. In the array region, multiple capacitor contact holes are provided on the semiconductor substrate, and a first conductive layer is deposited at a bottom of the capacitor contact holes. In the peripheral circuit region, a device layer is provided on the semiconductor substrate. At S11, the first conductive layer is treated to increase its roughness. At S12, the wire contact holes are formed in the peripheral circuit region. The wire contact holes expose the semiconductor substrate. At S13, a transition layer is formed, which at least covers a surface of the first conductive layer and a surface of the semiconductor substrate. The surface of the semiconductor substrate exposed by the wire contact holes. At S14, a second conductive layer is formed, which covers the transition layer, and fills the capacitor contact holes and the wire contact holes.

FIG. 2 to FIG. 9 illustrate a process for manufacturing a semiconductor structure in some embodiments of the disclosure.

Figure 2:
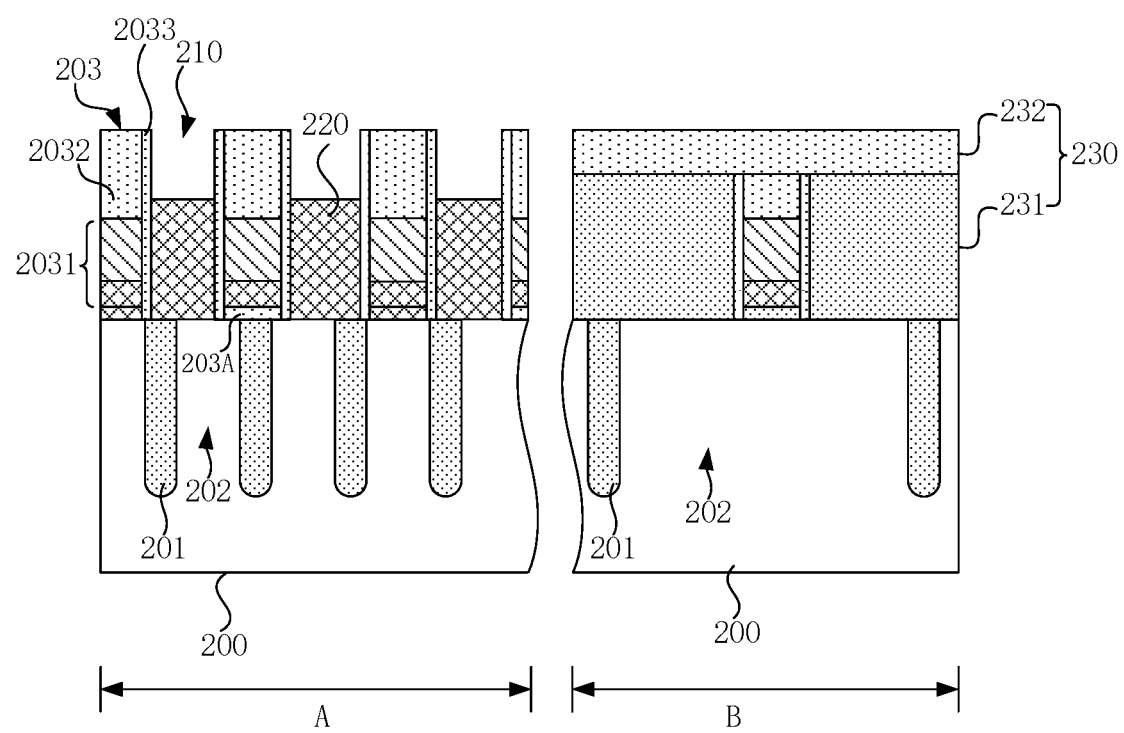
FIG. 2 illustrates a first diagram illustrating a process for manufacturing a semiconductor structure in some embodiments of the disclosure.
Figure 3:
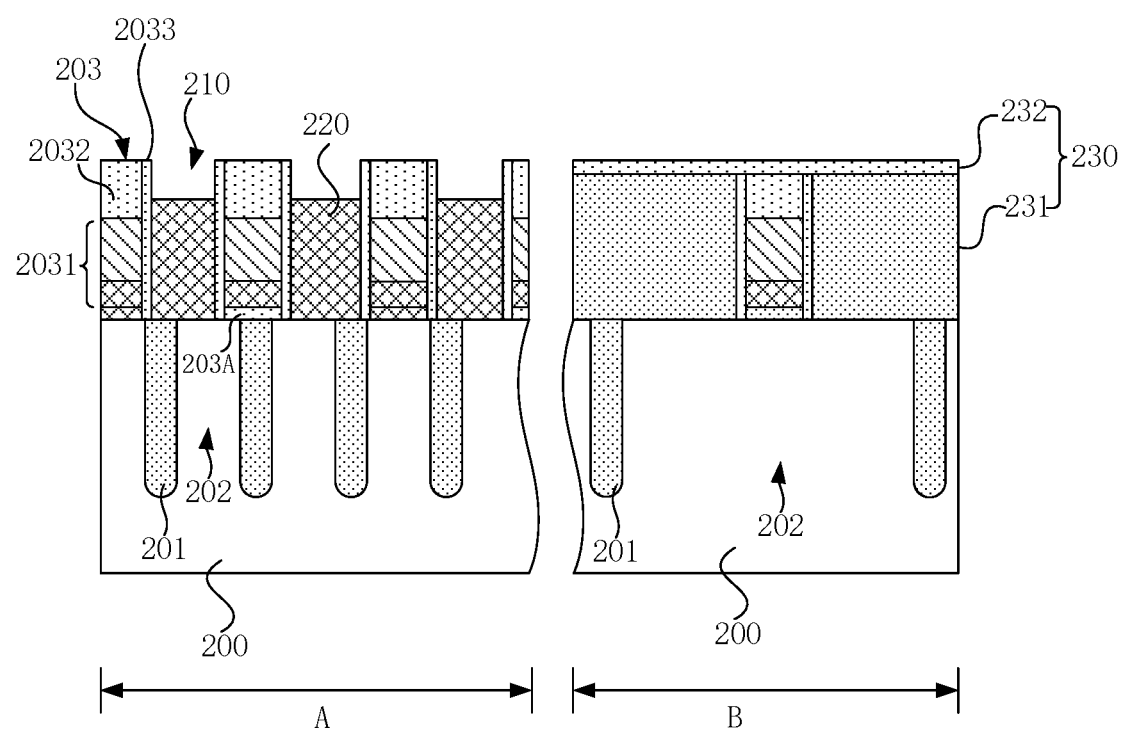
FIG. 3 illustrates a second diagram illustrating a process for manufacturing a semiconductor structure in some embodiments of the disclosure.

Referring to S10 and FIG. 2, a semiconductor substrate 200 is provided. The semiconductor substrate 200 includes an array region A and a peripheral circuit region B. In the array region A, multiple capacitor contact holes 210 are provided on the semiconductor substrate 200, and a first conductive layer 220 is deposited at a bottom of each of the capacitor contact holes 210. In the peripheral circuit region B, a device layer 230 is provided on the semiconductor substrate 200.

The semiconductor substrate 200 includes but is not limited to a silicon substrate or a germanium substrate.

In the array region A, a shallow trench isolation structure 201 and an active region 202 separated by the shallow trench isolation structure 201 are arranged on the semiconductor substrate 200. The capacitor contact holes 210 expose part of the active region 202. The first conductive layer 220 is deposited at the bottom of each of the capacitor contact holes 210, and electrically connects to the active region 202. In the example, the first conductive layer 220 is a polysilicon layer.

In some embodiments, multiple discrete bit line structures 203 are formed on the semiconductor substrate 200, spaces are respectively provided between adjacent bit line structures 203. The capacitor contact holes 210 are respectively provided in the spaced regions between the adjacent bit line structures 203. The bit line structure 203 extends along a set direction. In this example, the bit line structure 203 extends along a direction perpendicular to the paper.

Each bit line structure 203 includes a bit line contact island 203A and a bit line arranged on the bit line contact island 203A. The bit line contact islands 203A are arranged in an interval distribution on the semiconductor substrate 200. In this example, the bit line contact islands 203A are sequentially arranged in the extension direction of the bit lines 203. Each of the bit line contact islands 203A contacts the active region 202 in the semiconductor substrate 200, thereby electrically connecting the bit line to the active region 202. Specifically, in the sectional schematic diagram shown in FIG. 2, in a region presented with the bit line contact island 203A, the bit line is electrically connected to the active region 202 through the bit line contact island 203A. In a region without the bit line contact island 203A, an insulation layer is provided between the bit line and the active region, i.e., the bit line is not electrically connected with the active region 202. The bit line contact island 203A may be formed by a material such as polysilicon etc. Each of the bit lines may be constructed by multiple conductive layers 2031. In some embodiments, for example, each of the bit lines may be constructed by conductive layers of a polysilicon layer, a TiN layer, a metal tungsten layer and the like. A dielectric layer 2032 is provided on the conductive layer 2031, so as to protect the conductive layer. The dielectric layer 2032 may include but is not limited to a silicon nitride layer.

In some embodiments, each of the bit line structures 203 further include a protective layer 2033 disposed on the sidewall of the conductive layer 2031 and the sidewall of the dielectric layer 2032. The protective layer 2033 may be a silicon nitride layer.

In the peripheral circuit region B, the semiconductor substrate 200 includes a shallow trench isolation structures 201, an active region 202 separated by the shallow trench isolation structure 201, and a device layer 230 provided on the semiconductor substrate 200. The device layer 230 includes a conductive structure layer 231 and an insulation layer 232 that are arranged on the surface of the semiconductor substrate. A conductive structure is provided in the conductive structure layer 231, which corresponds to the active region 202. The conductive structure may serve as a gate of the transistor. The insulation layer 232 covers the conductive structure layer 231 to protect the conductive structure layer 231.

In some embodiments, for ease of performance of the subsequent process, for example, for ease of the filling of the subsequent second conductive layer (shown in FIG. 9), a thinning step is further included after S10. Specifically, referring to FIG. 3, the bit line structures 203 in the array region A and the device layer 230 in the peripheral circuit region B are thinned. In this step, in the array region A, the dielectric layer 2032 and the protective layer 2033 on the sidewall thereof are thinned, and the conductive layer 2031 of the bit line is not exposed; meanwhile in the peripheral circuit region B, the insulation layer 232 of the device layer 230 is thinned, and the conductive structure in the conductive structure layer 231 of the device layer 230 is not exposed. In some embodiments, the dielectric layer 2032, the protective layer 2033 and the insulation layer 232 may be thinned by etching and the like.

Figure 4:
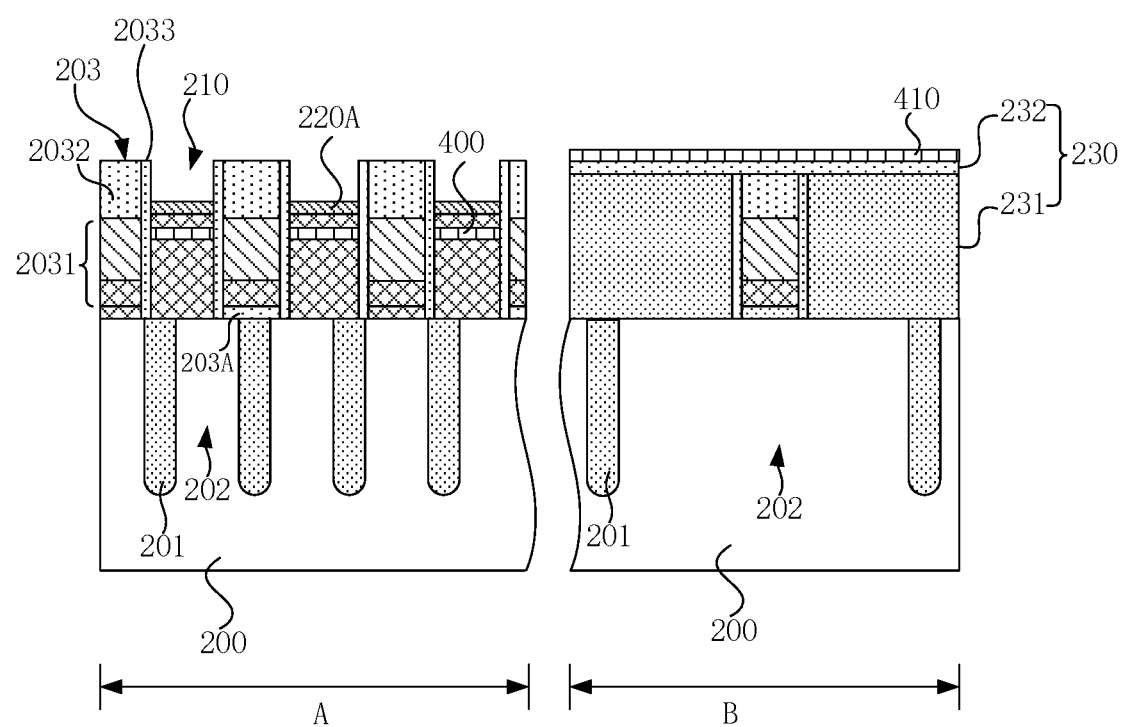
FIG. 4 illustrates a third diagram illustrating a process for manufacturing a semiconductor structure in some embodiments of the disclosure.
Figure 5:
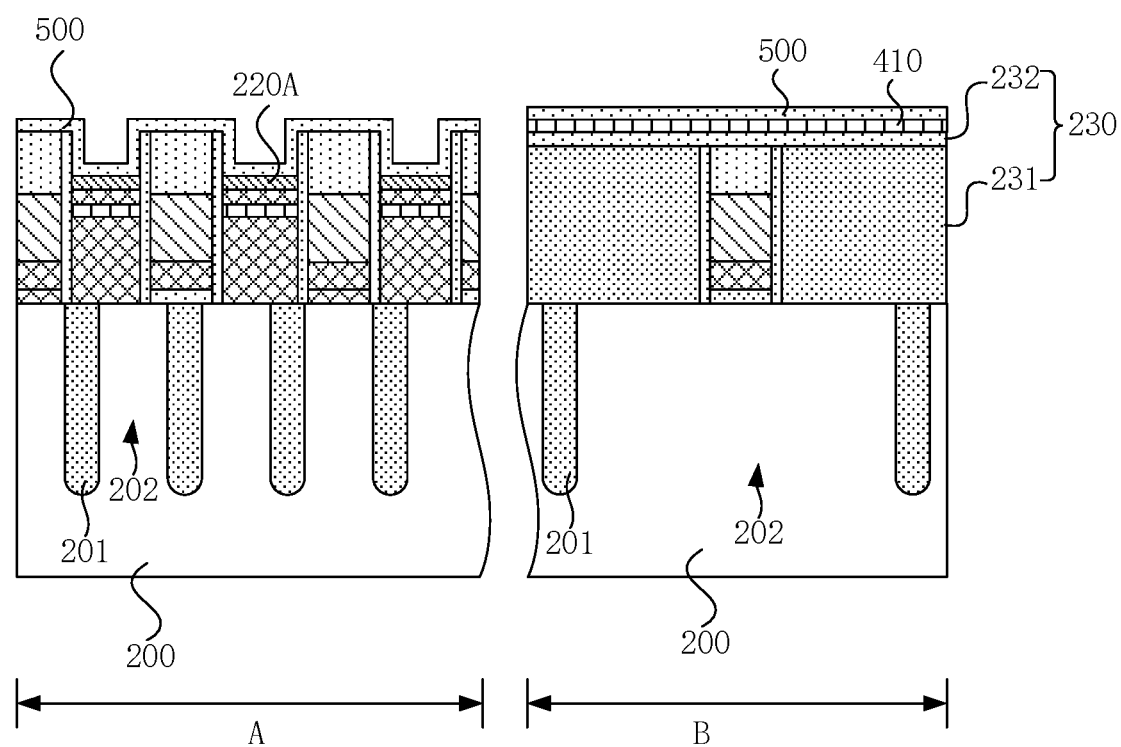
FIG. 5 illustrates a fourth diagram illustrating a process for manufacturing a semiconductor structure in some embodiments of the disclosure.

Referring to S11 and FIG. 4, the first conductive layer 220 is treated, to increase its roughness. In this step, with the increasing of the surface roughness of the first conductive layer 220, the surface area of its surface is increased, such that the contact area between the transition layer and the first conductive layer 220 is increased and thus the thickness of the transition layer is increased in the subsequent process of forming the transition layer 250 (shown in FIG. 8).

In the example, ion implantation is performed to the first conductive layer 220 to damage the surface evenness of the first conductive layer 220 thereby increasing the roughness of the first conductive layer 220. The affected region 220A on the surface of the first conductive layer 220 is shown by the shadow in FIG. 4. When the ion implantation is performed to the first conductive layer 220, ions bombard the surface of the first conductive layer 220, break the chemical bonds of the first conductive layer 220, and damage the surface evenness of it, such that the surface roughness of the first conductive layer 220 is increased. For example, when the material of the first conductive layer 220 is polysilicon, Si—Si chemical bonds in the polysilicon are broken by the ion implantation, and the surface evenness of the polysilicon is damaged, such that the surface roughness of the polysilicon is increased, and thus the subsequent reaction area between the transition layer and the polysilicon is increased, and as a result the thickness of the transition layer is increased.

The ion having a large atomic radius, such as the germanium ion, carbon ion or arsenic ion may be used for the ion implantation, to further break the chemical bonds of the first conductive layer 220, and to further increase the roughness of the first conductive layer 220.

As shown in FIG. 4, after the step of ion implantation, in the array region A, an ion implantation layer 400 is formed in the first conductive layer 220. In the peripheral circuit region B, due to the obstruction effect of the device layer 230, specifically, due to the obstruction effect of the insulation layer 232, the ions are not implanted into the device layer 230 but are deposited on the surface of the device layer 230, thereby forming the deposition layer 410. The depth of the ion implantation may be determined according to an actual condition; as long as the position of the ion implantation layer 400 formed after the ion implantation does not affect the formation of the subsequent transition layer 250.

In some embodiments, in order to avoid oxidation of the first conductive layer in the subsequent process, a step of forming an isolation layer is further included after S11. Specifically, referring to FIG. 5, the isolation layer 500 is formed. The isolation layer 500 covers the surface of the array region A and the surface of the peripheral circuit region B. In the example, the isolation layer 500 is a silicon nitride layer. In the array region A, it covers the surface of each bit line structure 203 and the surface of the first conductive layer 220. In the peripheral circuit region B, the isolation layer 500 covers the surface of the deposition layer 410.

Figure 6:
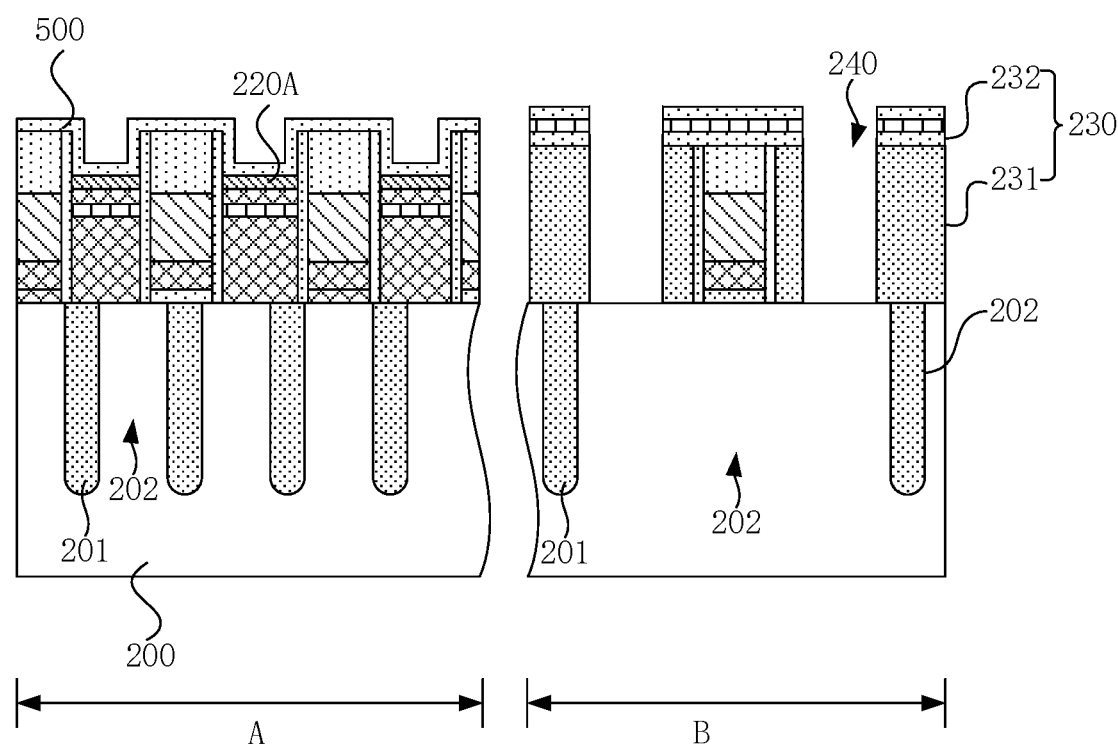
FIG. 6 illustrates a fifth diagram illustrating a process for manufacturing a semiconductor structure in some embodiments of the disclosure.

Referring to S12 and FIG. 6, in the peripheral circuit region B, wire contact holes 240 are formed which expose the semiconductor substrate 200. Specifically, in the example, the wire contact holes 240 are formed by photo-etching and etching processes. Each of the wire contact holes 240 penetrates through the deposition layer 410 and the device layer 230, and exposes the active region 202 of the semiconductor substrate 200. Each wire contact hole 240 is arranged at either sides of the conductive structure of the conductive structure layer 231.

It is understood that during the formation of the wire contact holes 240, the array region A is shielded by a mask, so as not to be etched.

Figure 7:
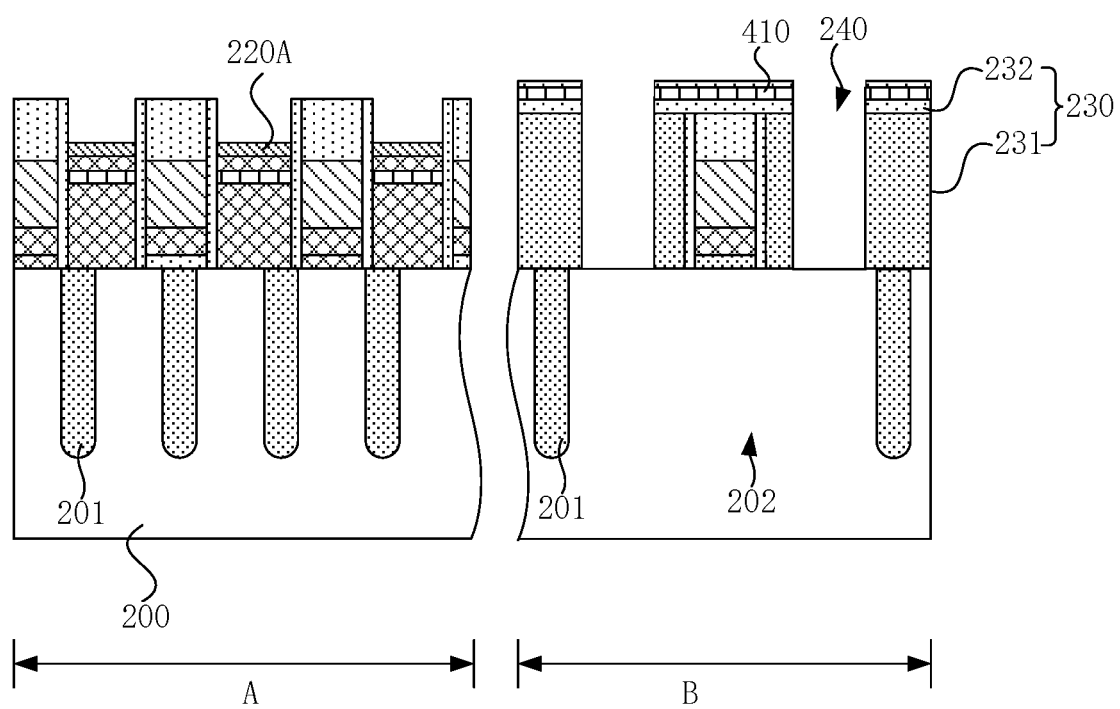
FIG. 7 illustrates a sixth diagram illustrating a process for manufacturing a semiconductor structure in some embodiments of the disclosure.

In some embodiments, referring to FIG. 7, after the wire contact holes are formed at S12, the following step may be further included: the isolation layer 500 is removed, to expose the first conductive layer 220. In this step, the isolation layer 500 may be removed by etching.

Figure 8:
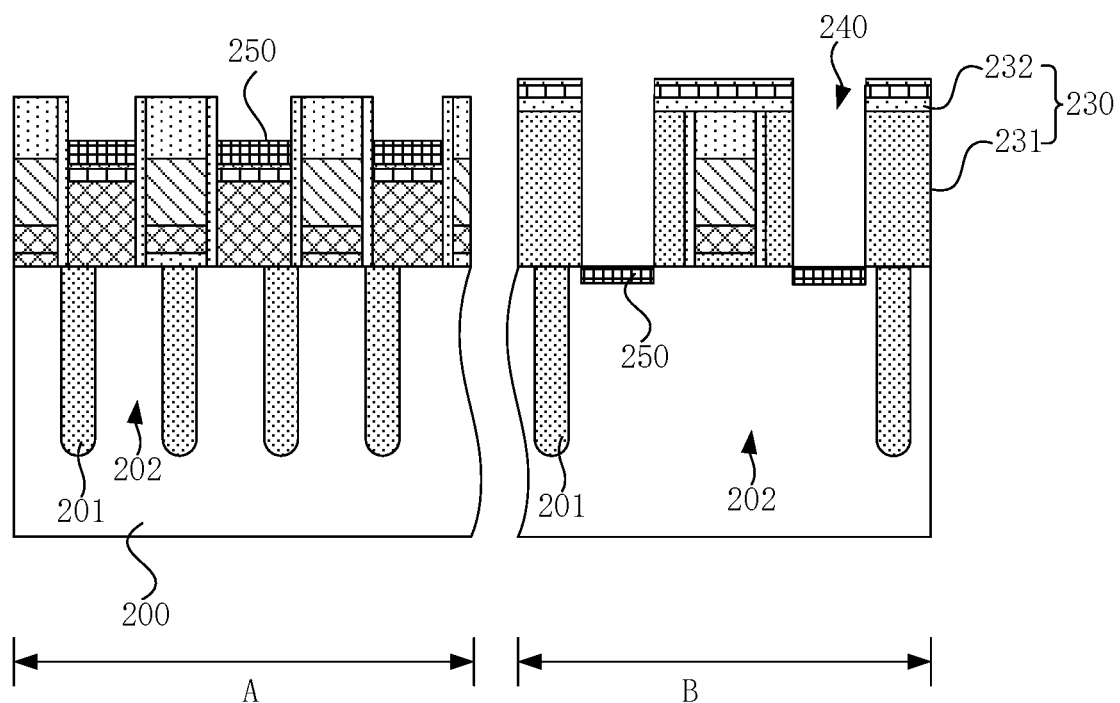
FIG. 8 illustrates a seventh diagram illustrating a process for manufacturing a semiconductor structure in some embodiments of the disclosure.

Referring to S13 and FIG. 8, a transition layer 250 is formed, the transition layer 250 at least coves a surface of the first conductive layer 220 and a surface of the semiconductor substrate 200 exposed by the wire contact holes 240.

In the example, the method for forming the transition layer 250 is that cobalt is deposited in the array region A and the peripheral circuit region B. At the bottom of each capacitor contact hole 210 and the bottom of each wire contact hole 240, the cobalt reacts with the semiconductor substrate 200 and the first conductive layer 220 to form the transition layer 250. In other regions, for example, on the sidewall of the capacitor contact hole 210 and on the sidewall of the wire contact hole 240, the cobalt is deposited to form a cobalt layer. After the cobalt is deposited, the cobalt layer on the sidewall of the capacitor contact hole 210 and the sidewall of the wire contact hole 240 is removed by a method of acid cleaning and the like, and the transition layer 250 is retained. Specifically, when the semiconductor substrate is the silicon substrate, and the first conductive layer 220 is the polysilicon layer, the cobalt reacts with the silicon at the bottoms of the capacitor contact holes 210 and the wire contact holes 240 to form a cobalt silicate (CoSix) layer. The cobalt silicate layer is the transition layer. In other regions, the cobalt is deposited to form the cobalt layer. After the cobalt is deposited, the cobalt layer is removed by cleaning. In FIG. 8 in order to clearly show the structure of the transition layer 250, the size of the transition layer 250 is appropriately exaggerated.

In some embodiments, after the transition layer 250 is formed, the RTP is performed under the environment of an inert gas. For example, the temperature of the manufacturing process is between 700° C. and 850° C. Therefore, the unreacted cobalt and the incompletely reacted CoSi-phase silicate in the capacitor contact holes 210 and the wire contact holes 240 are completely reacted to form the integral cobalt silicate layer, thereby further reducing the resistance.

At S13, the first conductive layer 220 is roughened, whereas the semiconductor substrate 200 exposed by the wire contact holes 240 is not roughened and has a flat surface, and thus the roughness of the surface of the first conductive layer 220 is greater than that of the semiconductor substrate 200 exposed by the wire contact holes 240. As a result, when the cobalt is deposited, the contact area between the cobalt and the first conductive layer 220 is greater than that between the cobalt and the semiconductor substrate 200 exposed by the wire contact holes 240, and the thickness of the transition layer 250 formed in the capacitor contact holes 210 is far greater than that of the transition layer 250 formed in the wire contact holes 240. For the array region A, the thicker the transition layer 250, the larger the conducting current, and the better the wire performance. For the peripheral circuit region B, the transition layer 250 is not too thick and does not lead to the overhigh conducting current, to avoid the breakdown effect and the increase of a current leakage.

Figure 9:
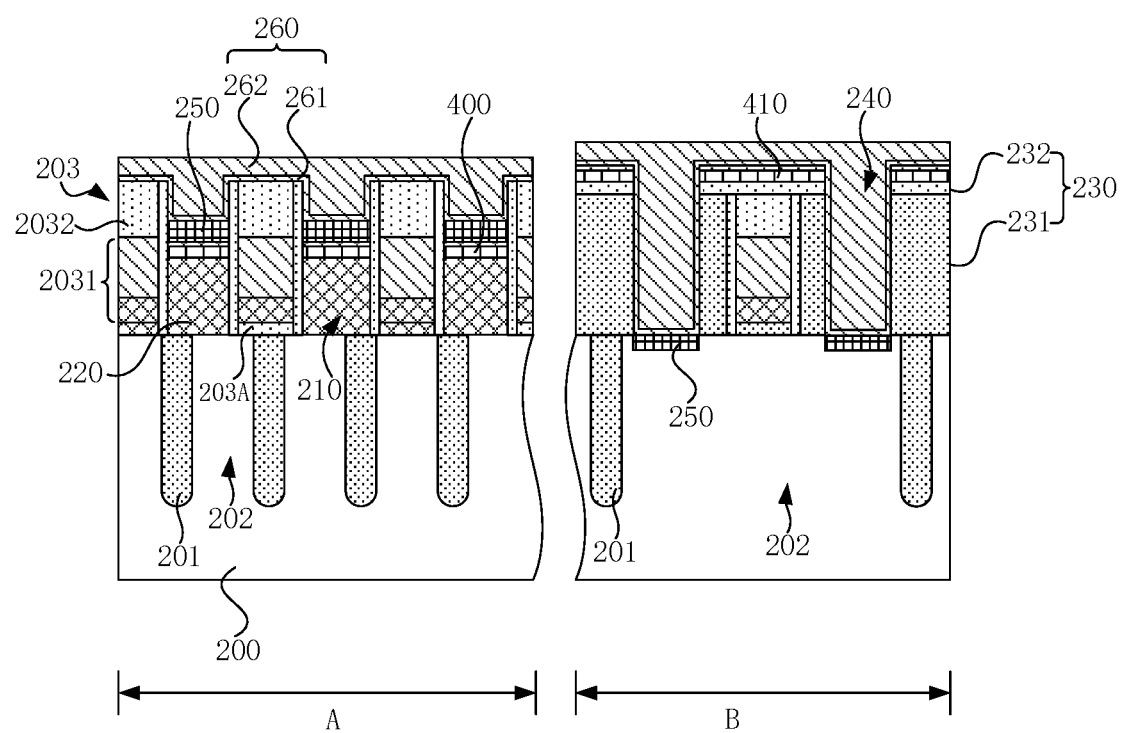
FIG. 9 illustrates an eighth diagram illustrating a process for manufacturing a semiconductor structure in some embodiments of the disclosure.

Referring to S14 and FIG. 9, a second conductive layer 260 is formed. The second conductive layer 260 covers the transition layer 250, and fills the capacitor contact holes 210 and the wire contact holes 240.

In the example, the second conductive layer 260 includes an adhesion layer 261 and a metal conductive layer 262. The step of forming the second conductive layer 260 further includes the following steps. The adhesion layer 261 is formed on the surface of the transition layer 250, the sidewall of the capacitor contact hole 210 and the sidewall of the wire contact hole 240. The adhesion layer 261 including but not limited to a TiN layer. The metal conductive layer 262 is formed on the surface of the adhesion layer 261. The metal conductive layer 262 fills the capacitor contact holes 210 and the wire contact holes 240. The metal conductive layer 262 may be a metal tungsten layer.

In the array region A, the first conductive layer 220, the transition layer 250 and the second conductive layer 260 are formed into a capacitor conductive structure. The transition layer 250 can reduce the contact resistance between the first conductive layer 220 and the second conductive layer 260.

In the peripheral circuit region B, the transition layer 250 and the second conductive layer 260 are formed to the wire structure. The transition layer 250 is connected to the semiconductor substrate 200 and the second conductive layer 260 respectively, and can reduce the contact resistance between the semiconductor substrate 200 and the second conductive layer 260 and increase the connection performance between the layers. In the peripheral circuit region, the wire structure contacts a source-drain region of the transistor of the semiconductor substrate 200, and is configured to lead out the source-drain region. The conductive structure in the conductive structure layer 231 of the device layer 230 serves as the gate of the transistor, and is configured to control the conduction of the transistor. The transistor mainly serves as a control circuit.

The method for manufacturing the semiconductor structure provided by the disclosure can form the transition layer thicker in the array region A and thinner in the peripheral circuit region B in the same step, which meets the requirements of the array region A and the peripheral circuit region B as well on the thickness of the transition layer, and greatly improves the performance of the semiconductor structure.

The disclosure further provides a semiconductor structure manufactured with the aforementioned preparation method. Referring to FIG. 9, the semiconductor structure includes a semiconductor substrate 200, multiple capacitor conductive structures and multiple wire structures.

The semiconductor substrate 200 includes an array region A and a peripheral circuit region B. In the array region A, multiple capacitor contact holes 210 are provided on the semiconductor substrate 200, which expose the semiconductor substrate 200. In the peripheral circuit region B, multiple wire contact holes 240 are provided on the semiconductor substrate 200, which expose the semiconductor substrate 200. Multiple capacitor conductive structures are respectively arranged in the capacitor contact holes 210. Each of the capacitor conductive structures includes a first conductive layer 220 filling a part of each of the capacitor contact holes 210, a transition layer 250 at least covering the first conductive layer 220 and a second conductive layer 260 covering the transition layer 250 and filling the capacitor contact holes 220. The first conductive layer 220 contacts the semiconductor substrate 200, and the transition layer 250 is formed on the first conductive layer 220. The transition layer 250 can reduce the contact resistance between the first conductive layer 220 and the second conductive layer 260, and improve the performance of the capacitor conductive structure.

In some embodiments, in the array region A, multiple discrete bit line structures 203 are arranged on the semiconductor substrate 200. Each of the capacitor contact holes 210 is provided between the bit line structures 203. Each of the capacitor conductive structure is also located between the bit line structures 203. Each of the bit line structure 203 includes a bit line contact island 203A and a bit line. The bit line contact island 203A contacts the semiconductor substrate 200, and the bit line is arranged on the bit line contact island 203A. In some embodiments, the bit line includes a conductive layer 2031 and a dielectric layer 2032 disposed on the conductive layer 2031.

In some embodiments, the capacitor conductive structure further includes an ion implantation layer 400, and the ion implantation layer 400 is located in the first conductive layer 220.

The multiple wire structures are respectively arranged in the conductive contact holes 240. Each of the wire structure includes a transition layer 250 covering a surface of the semiconductor substrate 200, and a second conductive layer 260 covering the transition layer 250 and filling the wire contact hole 240. The transition layer 250 contacts the semiconductor substrate 200. In some embodiments, in the peripheral circuit region B, a structure layer is provided on the semiconductor substrate 200. The wire contact hole 240 penetrates through the structure layer. The structure layer includes a device layer 230 and a deposition layer 410 located on the device layer 230. The deposition layer 410 and the ion implantation layer 400 are layers of a same material. For example, both are a germanium material layer, a carbon material layer or an arsenic material layer.

In some embodiments, the second conductive layer 260 includes an adhesion layer 261 and a metal conductive layer 262. The adhesion layer 261 at least covers a surface of the transition layer 250, and the metal conductive layer 262 covers the adhesion layer 261, and fills the capacitor contact holes 210 and the wire contact holes 240.

The thickness of the transition layer 250 of the capacitor conductive structure is more than that of the transition layer 250 of the wire structure, which meets requirements of the array region A and the peripheral circuit region B on the thickness of the transition layer, and greatly improves the performance of the semiconductor structure.

The above are only preferred examples of the disclosure. It should be pointed out that those of ordinary skill in the art may further make multiple improvements and modifications without departing from the principle of the disclosure, and these improvements and modifications are also should be considered within the scope of protection of the disclosure.

What is claimed is:

1. A method for manufacturing a semiconductor structure, comprising:
   providing a semiconductor substrate which comprises an array region and a peripheral circuit region, wherein in the array region, multiple capacitor contact holes are provided on the semiconductor substrate, and a first conductive layer is deposited on a bottom of each of the capacitor contact holes, and in the peripheral circuit region, a device layer is on the semiconductor substrate;
   treating the first conductive layer to increase roughness of the first conductive layer;
   forming wire contact holes exposing the semiconductor substrate in the peripheral circuit region;
   wherein a surface roughness of the first conductive layer in the capacitor contact holes is greater than a surface roughness of the semiconductor substrate exposed by the wire contact holes;
   forming a transition layer, wherein the transition layer of the array region covers at least the surface of the first conductive layer, and the transition layer of the peripheral circuit region is embedded in the semiconductor substrate exposed by the wire contact holes;
   wherein a thickness of the transition layer located in the array region is greater than that of the transition layer located in the peripheral circuit region; and
   forming a second conductive layer covering the transition layer, and filling the capacitor contact holes and the wire contact holes.

2. The method for manufacturing the semiconductor structure of claim 1, further comprising:
   forming multiple discrete bit line structures on the semiconductor substrate;
   providing the capacitor contact holes respectively between the bit line structures; and
   prior to said treating the first conductive layer, thinning the bit line structure of the array region and the device layer of the peripheral circuit region.

3. The method for manufacturing the semiconductor structure of claim 2, wherein
   each of the bit line structures comprises a bit line contact island and a bit line, wherein the bit line contact island contacts the semiconductor substrate, the bit line is arranged on the bit line contact island, and the bit line comprises a conductive layer and a dielectric layer disposed on the conductive layer, wherein the dielectric layer is thinned in said thinning.

4. The method for manufacturing the semiconductor structure of claim 1, wherein
   said treating the first conductive layer further comprises performing ion implantation to the first conductive layer, to damage a surface evenness of the first conductive layer, thereby increasing the roughness of the first conductive layer.

5. The method for manufacturing the semiconductor structure of claim 4, wherein
   the first conductive layer is a polysilicon layer, and said performing the ion implantation to the first conductive layer is of performing germanium ion, carbon ion or arsenic ion implantation to the first conductive layer.

6. The method for manufacturing the semiconductor structure of claim 1, further comprising:
   forming an isolation layer, which covers a surface of the array region and a surface of the peripheral circuit region after said treating the first conductive layer;
   and removing the isolation layer after said forming the wire contact holes in the peripheral circuit region.

7. The method for manufacturing the semiconductor structure of claim 1, wherein said forming the transition layer further comprises:
depositing a cobalt layer, wherein at the bottom of each of the capacitor contact hole and a bottom of each of the wire contact hole, cobalt reacts with the first conductive layer and the semiconductor substrate to form the transition layer; and
performing a rapid thermal process.

8. The method for manufacturing the semiconductor structure of claim 1, wherein
the second conductive layer comprises an adhesion layer and a metal conductive layer, and said forming the second conductive layer further comprises:
forming the adhesion layer on a surface of the transition layer; and
forming the metal conductive layer on a surface of the adhesion layer, wherein the metal conductive layer fills the capacitor contact holes and the wire contact holes.

* * * * *